(12) United States Patent
Sastry et al.

(10) Patent No.: US 10,305,089 B2
(45) Date of Patent: May 28, 2019

(54) PHASE CHANGE MATERIAL SOURCE FOR PHYSICAL VAPOR DEPOSITION

(71) Applicant: Sakti3, Inc., Ann Arbor, MI (US)

(72) Inventors: Ann Marie Sastry, Ann Arbor, MI (US); Myoungdo Chung, Ann Arbor, MI (US); HyonCheol Kim, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 0 days.

(21) Appl. No.: 15/445,740

(22) Filed: Feb. 28, 2017

(65) Prior Publication Data
US 2017/0194624 A1    Jul. 6, 2017

Related U.S. Application Data

(63) Continuation of application No. 14/964,921, filed on Dec. 10, 2015, now abandoned, which is a
(Continued)

(51) Int. Cl.
C23C 14/04 (2006.01)
C23C 14/08 (2006.01)
(Continued)

(52) U.S. Cl.
CPC ......... *H01M 4/0423* (2013.01); *C23C 14/042* (2013.01); *C23C 14/082* (2013.01); *C23C 14/14* (2013.01); *C23C 14/243* (2013.01); *C23C 14/246* (2013.01); *C23C 14/26* (2013.01); *C23C 14/505* (2013.01); *C23C 14/542* (2013.01);
(Continued)

(58) Field of Classification Search
CPC ....... C23C 14/16; C23C 14/24; C23C 14/246; C23C 14/26; C23C 14/28; C23C 14/14; C23C 14/56
See application file for complete search history.

(56) References Cited

U.S. PATENT DOCUMENTS 6,887,346 B2 *  5/2005  Lemme .............. C23C 16/4485
                                                      159/11.3
7,945,344 B2    5/2011  Wang et al.
(Continued)

FOREIGN PATENT DOCUMENTS

CN         1333385 A  *  1/2002  ............. C23C 14/12
KR    20010034156 A  *  4/2001
WO    WO-2012/095489     7/2012

OTHER PUBLICATIONS

Czsich et al. Atomizer design for viscous-melt atomization, Mat. Sci. Eng. A, 477, 2008, pp. 21-25.*
(Continued)

*Primary Examiner* — Kelly M Gambetta
(74) *Attorney, Agent, or Firm* — Morrison & Foerster LLP

(57) ABSTRACT

A method and apparatus for manufacturing electrochemical cells. The apparatus and method includes the modification of solid phase material used in electrochemical cells, such as batteries, into a viscous phase for ease of metering and dispensing onto a hot wall reactor to create a substantially uniform cloud of vapor to be deposited on a substrate or other stacks of cells in a continuous or semi-continuous process and having the useful advantage of depositing large volumes of materials for economical manufacturing.

23 Claims, 12 Drawing Sheets

Related U.S. Application Data continuation of application No. 13/728,969, filed on Dec. 27, 2012, now Pat. No. 9,240,584.

(51) Int. Cl.

| | | |
|---|---|---|
| *C23C 14/14* | (2006.01) | |
| *C23C 14/24* | (2006.01) | |
| *C23C 14/26* | (2006.01) | |
| *C23C 14/50* | (2006.01) | |
| *C23C 14/54* | (2006.01) | |
| *C23C 14/58* | (2006.01) | |
| *H01M 4/04* | (2006.01) | |
| *H01M 4/1395* | (2010.01) | |
| *H01M 10/052* | (2010.01) | |
| *H01M 10/058* | (2010.01) | |

(52) U.S. Cl.
CPC ......... *C23C 14/588* (2013.01); *H01M 4/0421* (2013.01); *H01M 4/0471* (2013.01); *H01M 4/1395* (2013.01); *H01M 10/052* (2013.01); *H01M 10/058* (2013.01); *Y02T 10/7011* (2013.01)

(56) References Cited

U.S. PATENT DOCUMENTS

| | | | |
|---|---|---|---|
| 9,240,584 | B1 | 1/2016 | Sastry et al. |
| 2003/0198849 | A1* | 10/2003 | Hampden-Smith ...... B01J 21/18 429/483 |
| 2009/0325063 | A1 | 12/2009 | Albano et al. |
| 2012/0055633 | A1 | 3/2012 | Kim et al. |
| 2012/0058280 | A1 | 3/2012 | Chung et al. |
| 2012/0058380 | A1 | 3/2012 | Wang et al. |
| 2013/0127080 | A1* | 5/2013 | Youssefi ................. B29B 9/00 264/8 |
| 2014/0127406 | A1 | 5/2014 | Banaszak et al. |

OTHER PUBLICATIONS

U.S. Appl. No. 13/407,609, filed Feb. 28, 2012, for Kim et al.
Sastry et al., U.S. Office Action dated Sep. 3, 2014, directed to U.S. Appl. No. 13/728,969; 8 pages.
Sastry et al., U.S. Office Action dated Apr. 27, 2015, directed to U.S. Appl. No. 13/728,969; 8 pages.
Sastry et al., U.S. Office Action dated Sep. 29, 2016, directed to U.S. Appl. No. 14/964,921; 8 pages.

* cited by examiner

Metal oxide deposition rate and flaw size | flaw density

12 Å/s by solid feed
1.07 µm² | 81k/cm²

44-09 | 2126X

40 Å/s max by solid feed
1.69 µm² | 148k/cm²

44-21 | 2126X

475 Å/s by phase change
0.89 µm² | 174k/cm²

45-53 | 2126X

Analysis area = Average of 3 × (128 µm × 128 µm)

PHASE CHANGE MATERIAL SOURCE FOR PHYSICAL VAPOR DEPOSITION

REFERENCE TO RELATED APPLICATIONS

This application is a continuation of U.S. patent application Ser. No. 14/964,921, filed Dec. 10, 2015, which is a continuation of U.S. patent application Ser. No. 13/728,969, filed Dec. 27, 2012, now U.S. Pat. No. 9,240,584, the entire contents of which are incorporated herein by reference. The present application also incorporates by reference, for all purposes, U.S. Pat. No. 7,945,344; U.S. Patent Publication Nos. 2009-0325063, 2012-0058380, 2012-0055633, 2012-0058280; and U.S. patent application Ser. No. 13/407,609.

BACKGROUND OF THE INVENTION

The present invention relates to manufacture of electro-chemical cells. More particularly, the present invention provides a method and system for a manufacturing facility for fabrication of thin film energy devices. Merely by way of example, the invention has been provided for the manufacture of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

Common electro-chemical cells often use liquid electrolytes. Such cells are typically used in many conventional applications. Alternative techniques for manufacturing electro-chemical cells include solid state cells. Such solid state cells are generally in the experimental state, have been difficult to make, and have not been successfully produced in large scale. Although promising, solid state cells have not been achieved due to limitations in cell structures and manufacturing techniques. These and other limitations have been described throughout the present specification and more particularly below.

Solid state batteries have been proven to have several advantages over conventional batteries using liquid electrolyte in lab settings. Safety is the foremost one. Solid state battery is intrinsically more stable than liquid electrolyte cells since it does not contain a liquid that causes undesirable reaction, resulting thermal runaway, and an explosion in the worst case. Solid state battery can store over 30% more energy for the same volume or over 50% more for the same mass than conventional batteries. Good cycle performance, more than 10,000 cycles, and a good high temperature stability also has been reported.

Despite of these outstanding properties of solid state batteries, there are challenges to address in the future to make this type of batteries available in the market. To exploit the compactness and high energy density, no metal housing or excessive substrate should be used. To be used in variety of applications such as consumer electronics or electric vehicle, large area and fast film deposition techniques at low cost should be developed. Also, a solid state, hybrid thin film energy storage and conversion device, such as solid-a state battery, a solid oxide fuel cell, a capacitor, a photovoltaic cell and a hybrid device of these, consists of several components of thin film layers. These thin film layers are made from different materials and of different thicknesses. The deposition rate of laying down a material using a physical vapor deposition technique to form the thin film layer varies with the material and the processing technique used. Each individual layer requires a different time to finish to make a thin film device.

The production rate of solid state batteries, in terms the number of device units made per unit time, depends on the slowest, rate-limiting processing step for the layer with the largest thickness to deposition rate ratio. Multiple deposition zones and multiple deposition chambers are used to speed up the rate-limiting processing step by distributing the deposition task in parallel to the assigned multiple zones and chambers. However, the added deposition zones and chambers increase the total capital and operational expenditure for the manufacturing facility. It is necessary to optimize the number of deposition zones and chambers to balance the competition between cost and production rate. The same optimization necessity exists for other solid state, hybrid thin film energy storage and conversion device manufacturing processing steps including chemical vapor deposition, atomic layer deposition, winding, slitting, packaging using a technique of at least but not limited to dip coating, and robotic arm operations for attaching leads, wiring, moving, handling and electronic control component assembling.

However, the existing manufacturing facilities for solid state, hybrid thin film energy storage and conversion devices, including solid-state batteries, solid oxide fuel cells, capacitors, photovoltaic cells and hybrid devices of these, are designed in an arbitrary and subjective intuition-based fashion without conducting a systematical and mathematical analysis to identify the optimal design.

From the above, it is seen that techniques for improving the charging methods and systems relating to solid state cells are highly desirable.

BRIEF SUMMARY OF THE INVENTION

The present invention relates to manufacture of electro-chemical cells. More particularly, the present invention provides a method and system for a manufacturing facility for fabrication of thin film energy devices. Merely by way of example, the invention has been provided for the manufacture of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

In an embodiment, the present invention provides an procedure for formation of one or more elements of an electrochemical cell using a complete process. The method can start with providing a substrate having a surface region. A solid source material can be subjected to thermal treatment to cause a phase change in the solid material source to a fluid source material. The fluid source material can be transferred to an evaporation region coupled to a reaction chamber region where the fluid source material is subjected to an energy source to cause the fluid source material to vaporize. The vapor can then be used to form a thickness of a deposition material overlying the surface of the substrate.

In a specific embodiment, the solid source material can be a lithium containing solid source material or a metal containing solid source material. These materials can be processed to change phase into their respective liquid and vapor forms for deposition. In an embodiment, the solid source material can be in intimate contact with the fluid source material, which can be transferred through a delivery device coupled to the fluid source material. The solid source material can include a powder, a pellet, or the like. In a specific embodiment, the metal containing solid source material can include a metal oxide, metal, metal phosphides, or metal phosphates, and the like.so In a specific embodiment, the thermal treatment can include a resistive heating element coupled to a controller configured with a source container holding the source material. The method can also include a mixing process to the fluid source material. The method can also include heating the evaporation region using the energy source. The energy source can include a resistive heating source, inductive heating source, electron beam heating source, or plasma heating source, a convection energy source, conduction energy source, radiation energy source, kinetic energy source, or combinations thereof. Those of ordinary skill in the art will recognize other variations, modifications, and alternatives.

Benefits are achieved over conventional techniques. Depending upon the specific embodiment, one or more of these benefits may be achieved. Embodiments of the present invention can include methods and systems for manufacturing a solid state thin film battery device, which can include benefits such as:

The ability to degas the solid material to be deposited to elevating the material to deposition temperature, thereby reducing defects caused by rapid heating of solid particles or gas evolution from a liquid pool.

The ability to control the feed of material to be deposited by a number of means, including temperature, pressure, orifice or control valve, weight, mass, color, refractive index, and the like.

The ability to measure the actual material deposited by a number of means, including crystal mass balance, EIS, optical reflection, XRF, and the like, and using these measurements to control, in a feedback scheme, the uniformity of deposit.

The ability to create a large surface area for high rate deposition with a continuous flow of new material balanced to depositing mass; thus offering first order control of film thickness and material properties.

The ability to store very large quantities of deposition materials in a safe and convenient solid manner, while continuously processing this material into a viscous state.

The freedom to design a multiple of evaporation sources and energizing schemes due to the rapid and controllable reaction of evaporating the deposition material in viscous state.

The ability to decouple, isolate, and provide environmental barriers between deposition sources to improve performance, which also enables a single vacuum chamber to process various materials without cross-contamination.

The ability to co-deposit two or more materials by mixing and matching a certain number of sources to get the specific ratio, to create alloys and doped materials with improved properties.

The ability to achieve flash evaporation, delivering a metered stream of evaporant to a hot wall reactor in a pattern wherein the balance between mass delivered and mass evaporated is constant without causing residence times, which would degrade the evaporant or coat the reactor surface.

The ability to provide efficient and accurate flash evaporation via a phase change apparatus that allows delivery of the evaporant or deposition source material in a proper phase, i.e. solid, liquid or gas phase.

It is further understood that the method itself may be a combination of methods and its incorporation may affect the electrochemical properties of the thin film in a beneficial manner, and may be the cause of significant improvements in ionic conductivity, electrical resistivity, contact resistance, and the like, all of which are incorporated herein.

Depending on the specific embodiment, one or more of these benefits may be achieved. Of course, there can be other variations, modifications, and alternatives. The present invention achieves these benefits and others in the context of unique and non-intuitive process technology. However, a further understanding of the nature and advantages of the present invention may be realized by reference to the latter portions of the specification and attached drawings. It is also clear that embodiments of the invention must be optimized or changed for materials and layer thicknesses, whoever, the intrinsic invention and its purpose are conserved.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
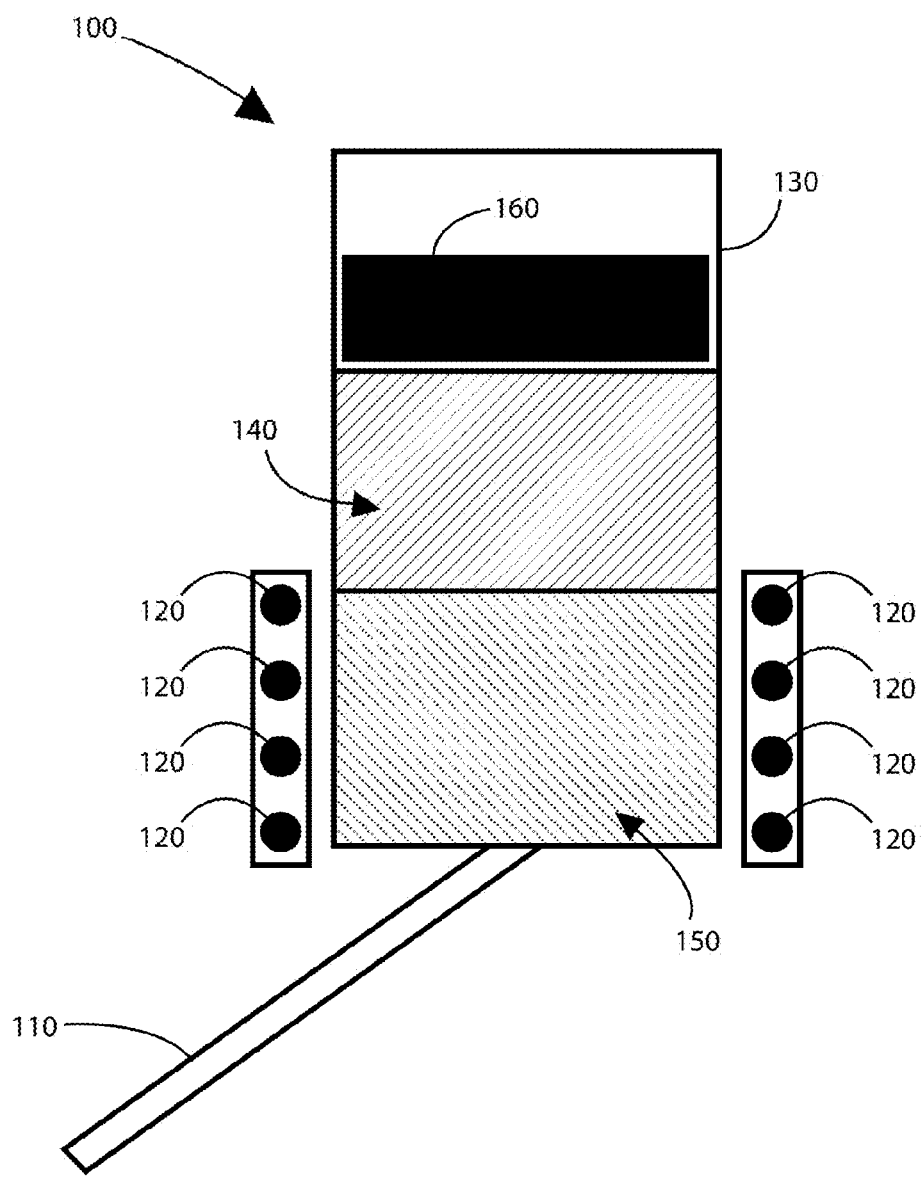
FIG. 1 is a simplified diagram of an apparatus for manufacturing electrochemical cells according to an embodiment of the present invention.

The present invention relates to manufacture of thin film devices. More particularly, the present invention provides a process and method for manufacturing a solid state thin film battery, capacitor, fuel cell, or combination device. Yet more particularly, the present invention relates to an electrochemical device such as a lithium ion battery. Merely by way of example, this invention has been described with the use of lithium based electrochemical cells, but it is recognized that other products could be designed in the same or like fashion. For example, a thin film battery made of materials such as zinc, silver, copper, cobalt, iron, manganese, magnesium or nickel is envisioned.

Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

It is well known that the commercial production of solid state lithium ion electrochemical devices, and in particular, batteries are hampered by the expense and difficulty of vacuum depositing high quality thin film materials in a large enough scale to be commercially viable.

It is further well known that if current technology were adequate or applicable, these difficulties would have been overcome and commercialized. To date, they have not.

Those knowledgeable in the field have attempted to build solid state thin film batteries, but have been limited to single layer, very small sized cells, and more importantly, to very small batch sizes. The batteries thus far produced are severely limited in energy and usefulness, and are not readily scalable. Chief among the scaling difficulties is the ability to engineer or develop a technology to deposit the very large amounts and thickness of individual layers needed to produce a battery of commercial size. It should be noted that there are no commercial products currently manufactured in high volume which have the requirements for mass deposited comparable to thin film solid state batteries.

Various vacuum deposition techniques have been investigate, such as sputtering, ALD, CVD, etc. however, experimentation has shown that PVD is the prime method of vacuum deposition which can have high enough deposition rates and has been scaled in other industries; however, there remain difficulties.

Turning to commercial PVD, and by way of example, in consumer electronics, an I-phone 4 has a current battery of approximately 16 CC's of active material. A very good efficiency for the ratio of deposition deposited on the device to the total amount of material consumed to is about 40%. Therefore, to manufacture a single battery, almost 40 CC's of material would have to be deposited (the rest coating shields, and other material within the coater).

To be viable, a production line would have to manufacture many hundreds of thousands of batteries per year, if not millions. The volume of deposited material for one million batteries is equivalent to 1400 cubic feet, or a room 8 feet by 8 feet by 22 feet. This is an unsustainable amount by current technology as illustrated by the following examples:

1. Large area glass coating. In this industry, many millions of square feet per year are coated with multilayer thin film coatings of materials not dissimilar to those used in the current invention. A typical in-line semi continuous sputter coater will produce up to 2.5 million square feet of glass per month. Such a coating line will also consume approximately 2.5 cubic feet of deposition material in the same time.
2. A high speed vacuum roll to roll coater producing metalized PET for potato chip bags can coat approximately 150,000 square feet per roll with less than a quarter of a cubic foot of aluminum.

Clearly, no present methods are acceptable to the manufacture of thin film solid state batteries that are useful in replacing current technology, particularly those batteries for extended use in consumer electronics or in automobiles.

As described in detail in U.S. Pat. No. 7,945,344 and U.S. Patent Publication Nos. 2009-0325063; 2012-0058380; 2012-0055633; and 2012-0058280; and U.S. patent application Ser. No. 13/407,609, which are hereby incorporated, various apparatus and techniques for the deposition of solid materials suitable for thin film batteries; however, the present invention addresses a new and novel apparatus specifically designed to improve on current technology.

As noted above, some prime materials for solid state thin film batteries cannot be simply deposited by heating as the temperatures necessary for evaporation are above decomposition temperatures rendering the source material no longer suitable. One method that overcomes this difficulty is flash evaporation whereby the solid material is introduced to the heated deposition source in a state of high surface to volume ratio and the evaporation rate is balanced with the mass flow of material to form a stable heated area.

It remains, however, difficult to introduce sufficient solid material, in a continuous manner and over the long processing times required and to maintain precise thickness, stoichiometry, and crystal structure.

By way of this invention, it has been discovered that there exists a liquid or gas phase, for many key source materials useful in solid state batteries, which does not cause decomposition, and does allow viscous flow.

According to the present invention, apparatus and methods related to manufacture of thin film devices, and in particular electrochemical cells are provided.

One element of the invention relates to the ability to modify the flow of the viscous deposition material by varying the temperature of the delivery device. The temperature of the delivery device may be achieved by resistance heating, radiant heating, induction heating and the like.

A further element of the invention pertains to the metering of the delivery of the viscous deposition material via control valves, with feedback via measuring weight, measuring volume, measuring mass flow, their combinations and the like.

A further element of the invention pertains to the application of pressure to the viscous deposition material whereby a differential pressure between the reservoir of viscous material and the outlet of the delivery tube is achieved by dead weight on a movable plate or piston in connection to the deposition material either in is viscous or solid state A further element of the invention pertains to the application of pressure to the viscous deposition material whereby a differential pressure between the reservoir of viscous material and the outlet of the delivery device is achieved by mechanical movement on a movable plate or piston in connection to the deposition material either in is viscous or solid state. Mechanical movement may be achieved by a number of schemes including, but not limited to, linear motors, screw jacks, pneumatic cylinders, levers, cams, chains and sprocket and the like, both located inside or outside of the vacuum environment.

A further element of the invention pertains to the application of spray nozzle or ultrasonic vibration by a solenoid and the like to the viscous deposition material to form very fine droplets or even vaporized mist as an alternative to the liquid phase that is delivered to the hot surface of the reactor, which is to provide ideal condition for very high rate flash evaporation without causing any material decomposition or generating residue of deposition materials.

A further element of the invention pertains to the ability to utilize multiple deposition sources for sequential deposition of all needed layer stacks in the same vacuum chamber thus allowing for a low cost manufacturing method of high quality and yield.

Yet a further element of the invention results in the ability to manufacture, in a cost effective manner, repeating electrochemical devices, such as solid state batteries, in numbers greater than 1000 without mechanical failure.

A further element of the invention, made possible by the above feature, is the ability to optimize energy density by manufacturing a solid state battery consisting of a multitude of such batteries in parallel, in a cost effective manner.

A unique element of the invention is the non-intuitive ability to modify the deposition material by mixing viscous forming material and non-viscous forming materials together to create a matrix of non-viscous forming particles carried within a viscous element thus allow dispensing and control as a liquid.

Another novel element of the invention is the ability to couple multiple evaporation sources, like hot wall reactors, or energetic particles, each having different and unique methods for deposition of certain layers.

Yet another novel element of the invention is the ability to utilize two or more disparate or individually configured methods to multi-deposit significantly different materials which are not compatible with co deposition from a single unit. Examples in electrochemical devices such as batteries include the multi deposition of cathode and anode chemistries. These chemistries include, but are not limited to layers of vanadium, cobalt, nickel, iron, aluminum, magnesium, lithium, lithium alloys, silicon—lithium compounds, phosphates, phosphides, lithiates, sulphides, sulphates, and the like.

Yet another novel element of the invention is the ability to cost effectively manufacture a wide variety of functionally graded materials inherent in the inventions ability to vary deposition methods or processes.

Examples enabled by the invention include, but are not limited to, varying the amounts of cathode to anode material throughout the thickness of a combination or multi-deposited depleted cathode layer, graded index or layered shear films tailoring adhesion, mechanical strength, smoothing, level of shear or modulus, and surface energy.

FIG. 1 is a simplified diagram of an apparatus for manufacturing electrochemical cells according to an embodiment of the present invention. This diagram is merely an illustration and should not unduly limit the scope of the claims herein. As shown, the apparatus 100 includes a delivery path 110, a heating element 120, and a deposition source material container 130. In an embodiment, the material container 130 can include a deposition source material including a solid material portion 140 and a liquid or gaseous material portion 150. The delivery path 110 is configured to dispense the viscous deposition material onto or into an evaporation device. The heating element 120 is configured to transfer heat only to the lower portion of the phase change device to induce the liquid or gas material portion 140. Also, the apparatus can include a dead weight 160, which provides constant force to the deposition material within the material container 130.

Figure 2:
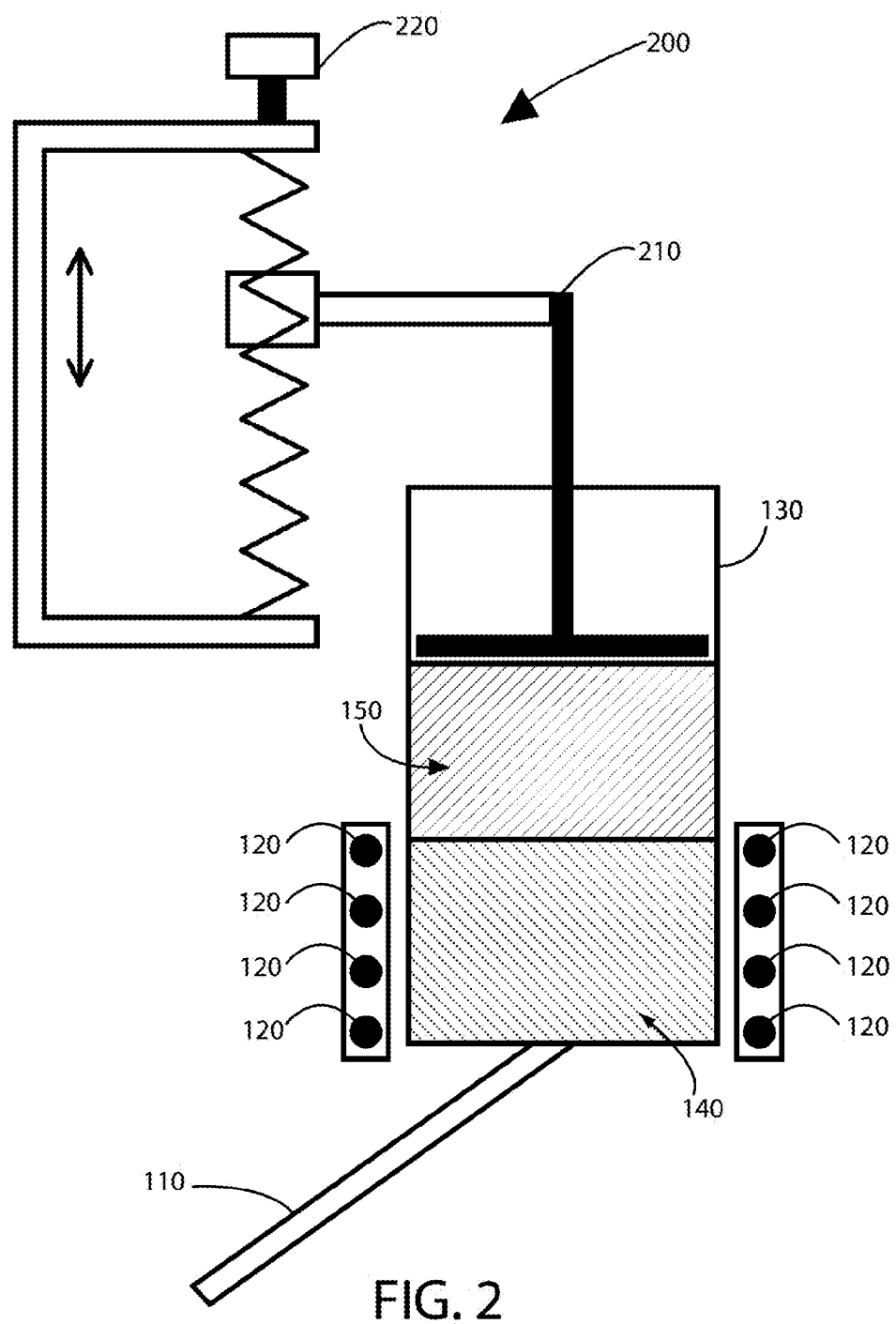
FIG. 2 is a simplified diagram of an apparatus for manufacturing electrochemical cells according to an embodiment of the present invention.

FIG. 2 is a simplified diagram an apparatus for manufacturing electrochemical cells according to an embodiment of the present invention. This diagram is merely an illustration and should not unduly limit the scope of the claims herein. As shown, apparatus 200 includes similar elements as in the apparatus of FIG. 1 coupled to a mechanical linear drive 210 that can be powered by an electric motor, spring, pneumatic, or hydraulic pressure device 220, or the like. The motors implemented in this device van include linear, stepper, AC, DC, servo types with and without encoders, and the like. These items can be mounted inside or outside of the vacuum environment as well. In a specific environment, apparatus 200 can be configured with feedback control.

Figure 3A:
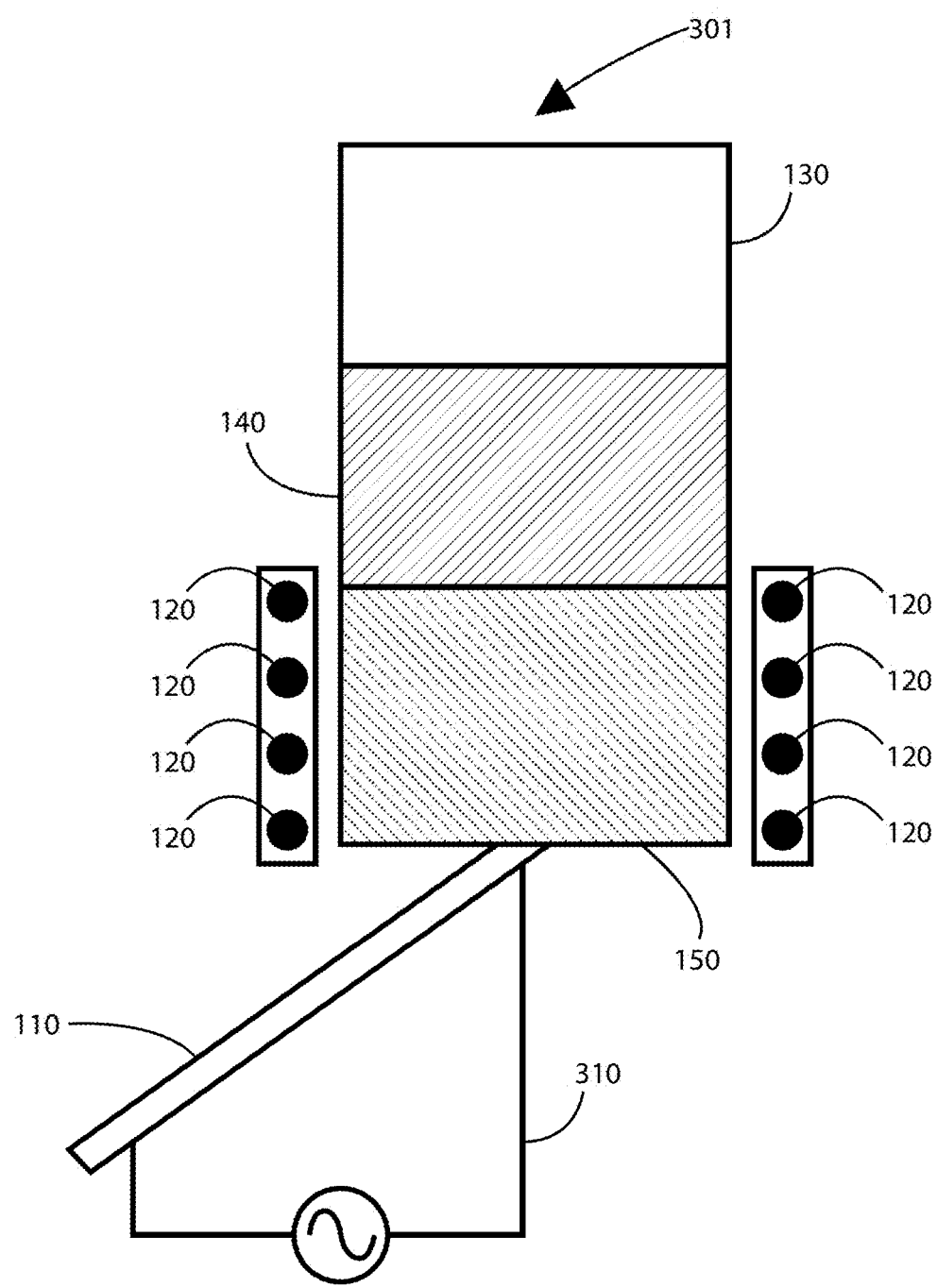
FIGS. 3A and 3B are simplified diagrams of apparatuses for manufacturing electrochemical cells according to embodiments of the present invention.
Figure 3B:
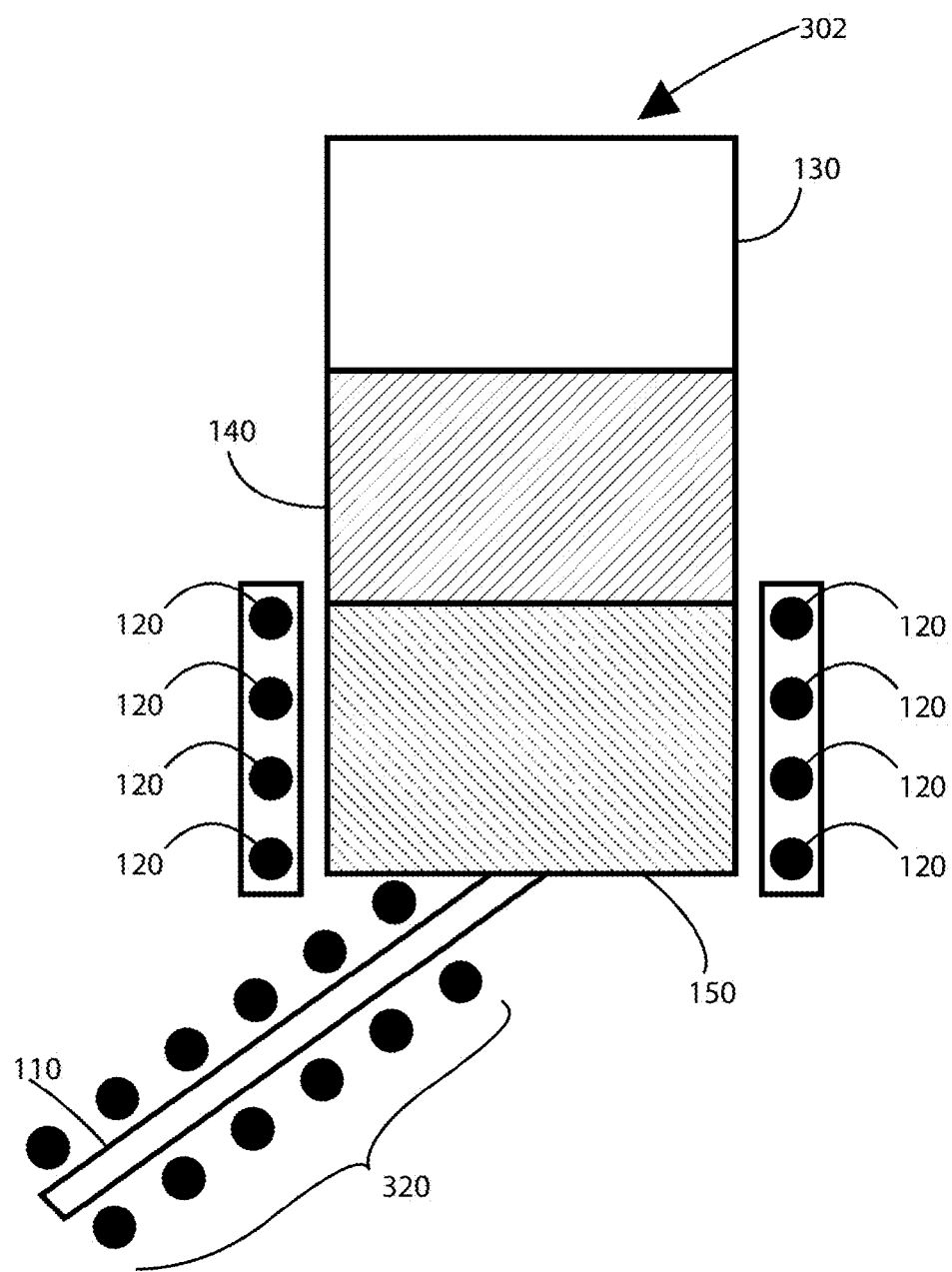

FIGS. 3A and 3B are simplified diagrams of apparatuses for manufacturing electrochemical cells according to embodiments of the present invention. Apparatuses 301 and 302 in these figures each depict a different embodiment implementing a heating element coupled to the delivery tube 110. In FIG. 3A, the delivery tube 110 is coupled to a resistive heating element 310. In FIG. 3B, the delivery tube 110 is coupled to an induction heating element 320, which uses electromagnetic induction through an electrically conducting delivery tube 110. In a specific embodiment, these apparatuses can be configured in vacuum. By changing the temperature of the delivery device, the viscosity the deposition material can be controlled. This configuration allows for direct control, via feedback, of the mass flow of the deposition material, which allows for controlled thickness of the deposited thin film.

Figure 4:
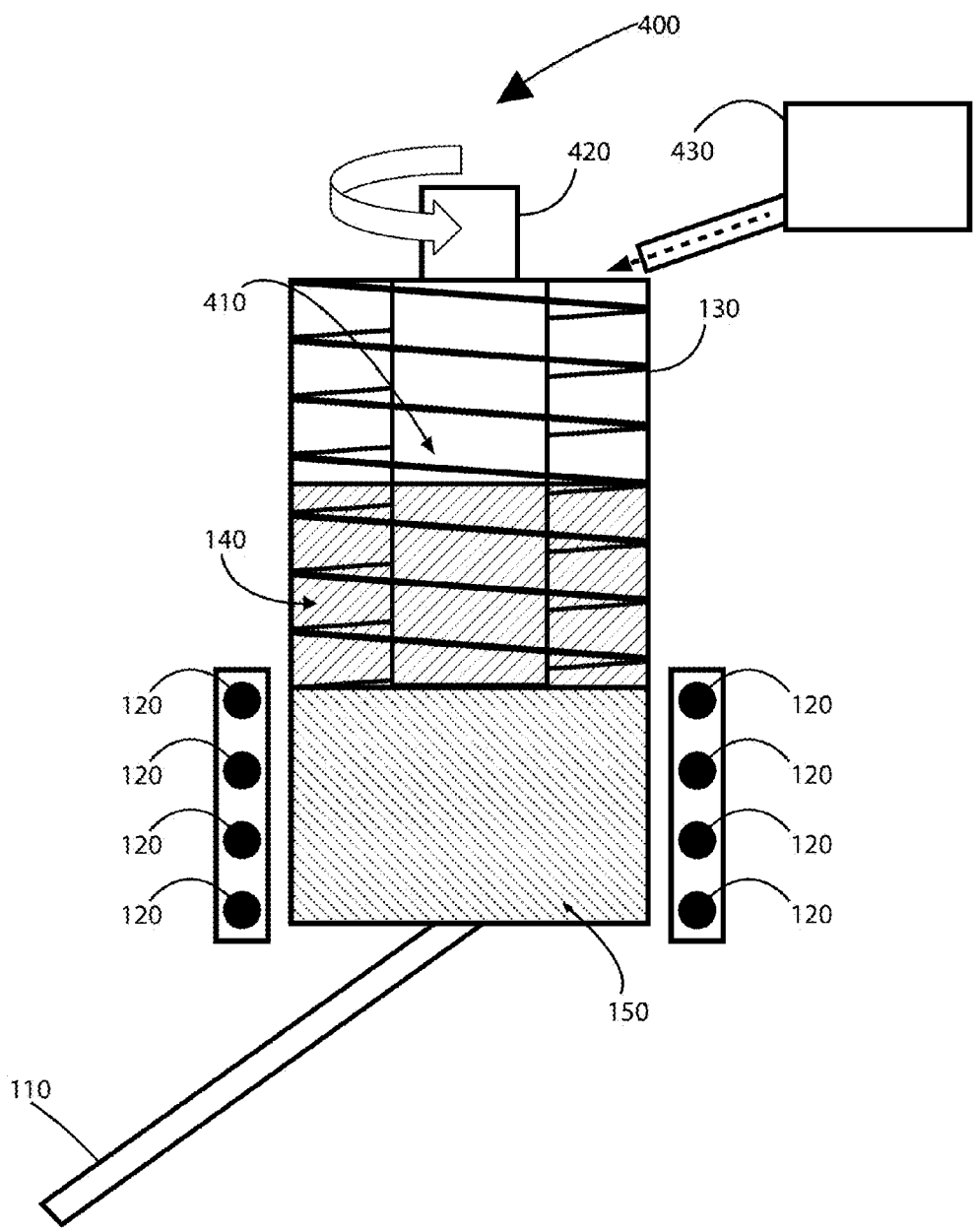
FIG. 4 is a simplified diagram of an apparatus for manufacturing electrochemical cells according to an embodiment of the present invention.

FIG. 4 is a simplified diagram of an apparatus for manufacturing electrochemical cells according to an embodiment of the present invention. This diagram is merely an illustration and should not unduly limit the scope of the claims herein. As shown, apparatus 400 includes a delivery device including an auger 410 driven by an actuation device 420, such as an electric motor, a hydraulic motor, and the like. The actuation device 420 is used to supply differential pressure to the viscous phase of the deposition material and the delivery tube 110, and also to continuously transfer the solid phase material to the heating zone of the device. This configuration allows for the continuous feeding of new solid phase deposition material from a reservoir 430 containing a source deposition material.

Figure 5:
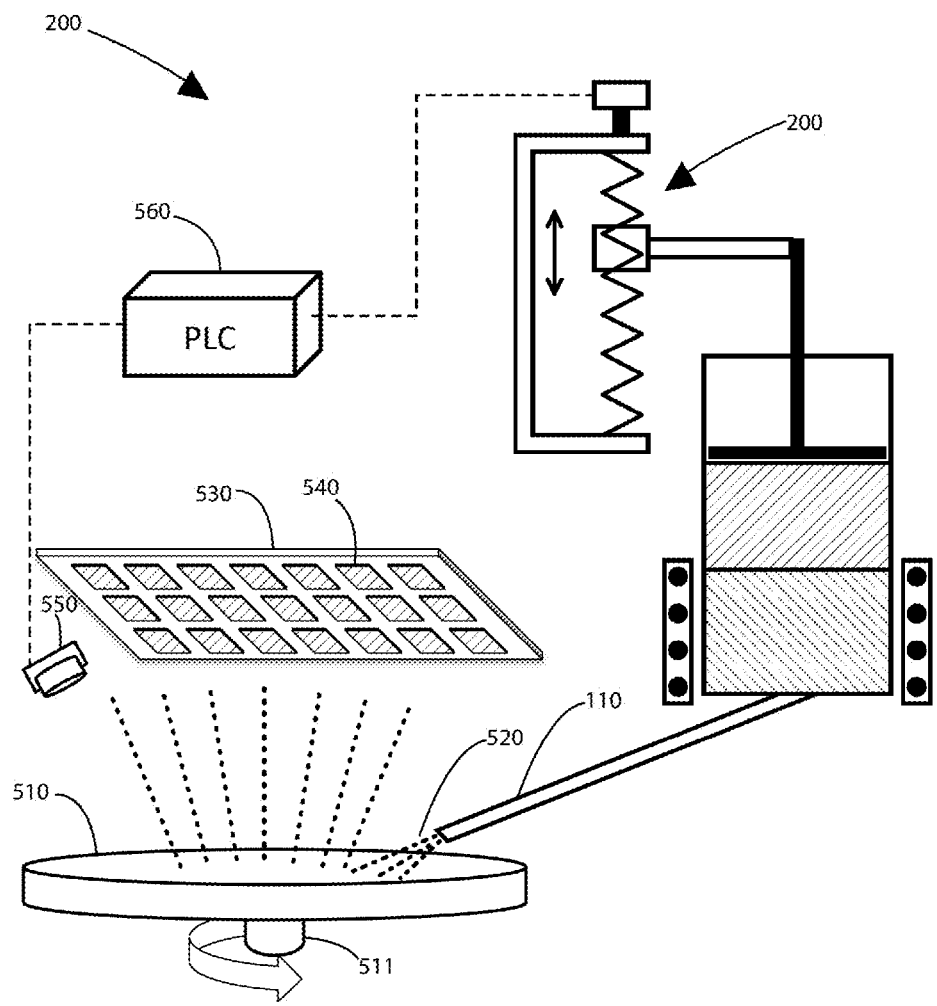
FIG. 5 is a simplified diagram of an apparatus for manufacturing electrochemical cells according to an embodiment of the present invention.

FIG. 5 is a simplified diagram of an apparatus for manufacturing electrochemical cells according to an embodiment of the present invention. This diagram is merely an illustration and should not unduly limit the scope of the claims herein. As shown, apparatus 500 includes a delivery device coupled to an evaporation device. The delivery device shown is similar to apparatus 200 of FIG. 2. The evaporation device includes a hot wall reactor configured to deliver deposition material 520 to a substrate 530 to form electrochemical cells 540.

In a specific embodiment, the hot wall reactor includes a spinning disc 510 coupled to a shaft 511. This disc 510 receives viscous phase deposition material 520 from the end of the delivery tube of the delivery device. The hot disc 510 can be heated by an energy source 550 using a number of means, including but not limited to, resistive heating, inductive heating, radiation heating, electron beam heating, plasma heating, and the like. The energy source 550, as well as the drive apparatus 200 in the delivery device, can be controlled by a programmable logic controlled (PLC) 560.

In a specific embodiment, the disc can include materials which have little or no reaction to the deposition materials and include at least one of the following: carbon, titanium, stainless steel, incoloy, incanel, tantalum, tungsten, vanadium, molybdenum, and the like. The disc 510 can also include additional elements to scrape the surface to keep it in a condition suitable for efficient deposition. The scraping element can include a blade, which can be used in a continuous or intermediate manner for continuous operation of the deposition device.

In a specific embodiment, the speed of the spinning disc 510 can be controlled to form an efficient thin layer of the viscous phase of the deposition material 520, and may be varied in speed and temperature in response to the deposition rate required. The disc speed and the scraping element compression force may be finely tuned to remove, by centripetal force, debris formed by incomplete or over complete heating of the deposition material, thus helping to maintain the apparatus in an efficient manufacturing state.

In a specific embodiment, the delivery tube 110 of the delivery device can include additional elements to assist in the deposition of the source material, such as a spray nozzle or use ultrasonic vibration by a solenoid and the like. These additional elements can direct the viscous deposition material 520 to be formed as very fine droplets or vaporized mist that is delivered to the hot surface of the reactor. Ideal conditions for the deposition material can be provided for a very high rate flash evaporation without causing any material decomposition or generating residue from the deposition materials.

Conventional manufacturing apparatuses do not address the needs of the high speed manufacturing or multilayer solid state devices. Embodiments such as the one shown in FIG. 5 can overcome the limitations of conventional manufacturing apparatuses. Many of the features depicted in this embodiment are also applicable to stationary heated hot wall reactions, which is encompassed within the scope of the present invention. Those of ordinary skill in the art will recognize other variations, modifications, and alternatives.

Figure 6:
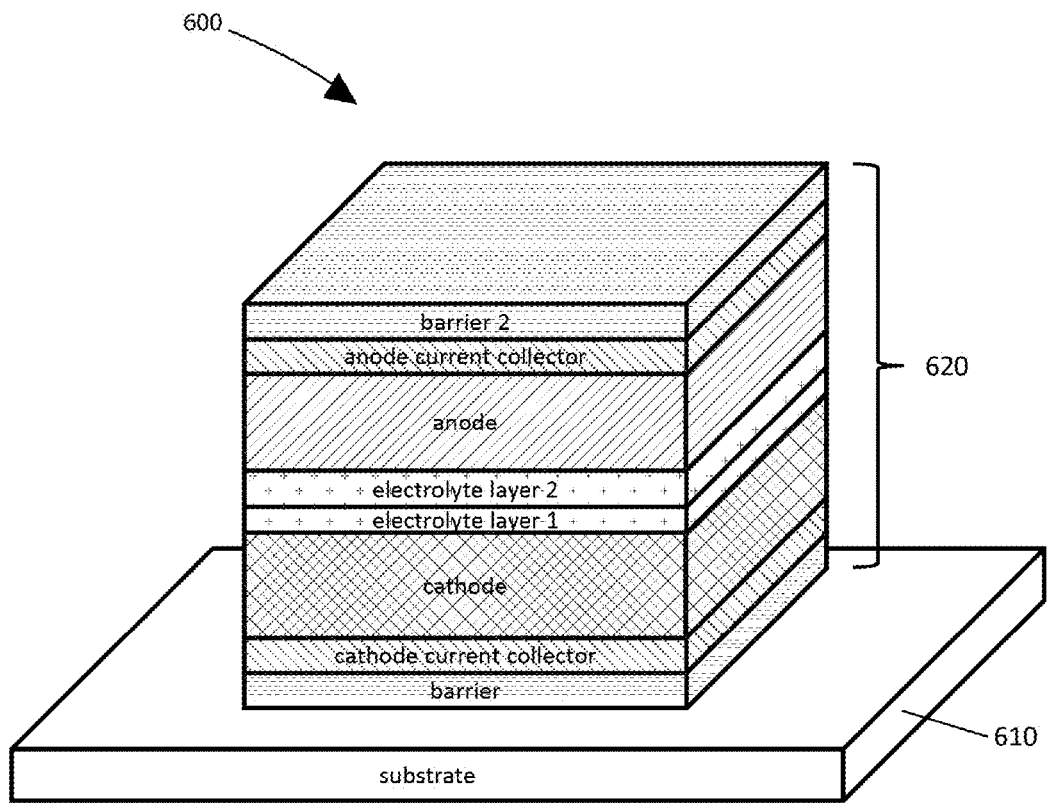
FIG. 6 is a simplified diagram of an electrochemical cell according to an embodiment of the present invention.

FIG. 6 is a simplified diagram of an electrochemical cell according to an embodiment of the present invention. This diagram is merely an illustration and should not unduly limit the scope of the claims herein. As shown, electrochemical cell 600 includes electrochemical cell layers 620 deposited on a substrate 610. This cell 600 is a simplified battery configuration, which depicts the deposition process. A specific embodiment of the method of manufacturing an electrochemical cell is provided below.

In an embodiment, the first step includes introducing the substrate 610 into a deposition chamber. The substrate can include masking devices for the series of layers to be deposited. In a second step, a barrier material is deposited on the substrate, which prevents any reaction between the substrate and the battery materials during the fabrication process and during the battery life cycle. This barrier material also works as an insulating layer in the cases that the substrate is electrically conductive.

In a third step, the number of cell layers is compared to a target value based on the battery capacity, and the process steps for depositing layers of an electrochemical cell is set to continue until the final cell layer is made. In a fourth step, a current collector material for a cathode or positive terminal is deposited. In a fifth step, a cathode material is deposited on the cathode current collector. A thermal energy source, such as a hot wall reactor or an electron beam source, is used for the evaporation of a metal oxide to form the cathode material that is delivered by the phase change delivery device described previously.

In a sixth step, an electrolyte material is deposited over the cathode with a slow rate as a first layer of a bi-layer electrolyte structure. The thermal energy source is also used for the evaporation of an oxide and a phosphide, phosphate, sulfate, or borate with an ion beam source introducing an ionic species to the deposited film to increase ionic conductivity of the electrolyte.

In a seventh step, a second layer of electrolyte is continuously deposited with a faster deposition rate to form a sufficient thickness of the bi-layer electrolyte. The ion-to-atom ration remains the same by controlling the ion beam source throughout the two electrolyte deposition processes (sixth and seventh steps), for uniform material composition and chemical characteristics, such as conductivity.

In an eighth step; an anode material is deposited over the electrolyte by using another phase change delivery source. In a ninth step, an anode current collector material is deposited on the anode. In a tenth step, another barrier material is deposited over the anode and the anode current collector providing an insulation and separation between the anode and the next cell layer. This completes the deposition of a basic single layer electrochemical cell.

Then, the process flow goes back to the third step to compare the number of cell layers to the target value. The process continues to build multiple cell layers until the target number of cell layers is reached, which triggers the next step. In an eleventh step, a final barrier material is deposited over the full number of cell layers to provide a hermetic seal to the battery materials.

In a twelfth step, the battery films, including multiple layers of barriers, current collectors, cathodes, electrolytes, and anodes are packaged for mechanical support and electrical connection. The above sequence of steps forms the stack of layers shown in cell 600 of FIG. 6. These steps utilize the phase change delivery device and the phase change source process as described previously according to an embodiment of the present invention. Of course, those of ordinary skill in the art will recognize other variations, modifications, and alternatives.

In an embodiment, the present invention provides an procedure for formation of one or more elements of an electrochemical cell using a complete process. The method can start with providing a substrate having a surface region.

A solid source material can be subjected to thermal treatment to cause a phase change in the solid material source to a fluid source material. The fluid source material can be transferred to an evaporation region coupled to a reaction chamber region where the fluid source material is subjected to an energy source to cause the fluid source material to vaporize. The vapor can then be used to form a thickness of a deposition material overlying the surface of the substrate.

In a specific embodiment, the solid source material can be a lithium containing solid source material or a metal containing solid source material. These materials can be processed to change phase into their respective liquid and vapor forms for deposition. In an embodiment, the solid source material can be in intimate contact with the fluid source material, which can be transferred through a delivery device coupled to the fluid source material. The solid source material can include a powder, a pellet, or the like. In a specific embodiment, the metal containing solid source material can include a metal oxide, metal, metal phosphides, or metal phosphates, and the like.so In a specific embodiment, the thermal treatment can include a resistive heating element coupled to a controller configured with a source container holding the source material. The method can also include a mixing process to the fluid source material. The method can also include heating the evaporation region using the energy source. The energy source can include a resistive heating source, inductive heating source, electron beam heating source, or plasma heating source, a convection energy source, conduction energy source, radiation energy source, kinetic energy source, or combinations thereof. Those of ordinary skill in the art will recognize other variations, modifications, and alternatives.

Figure 7:
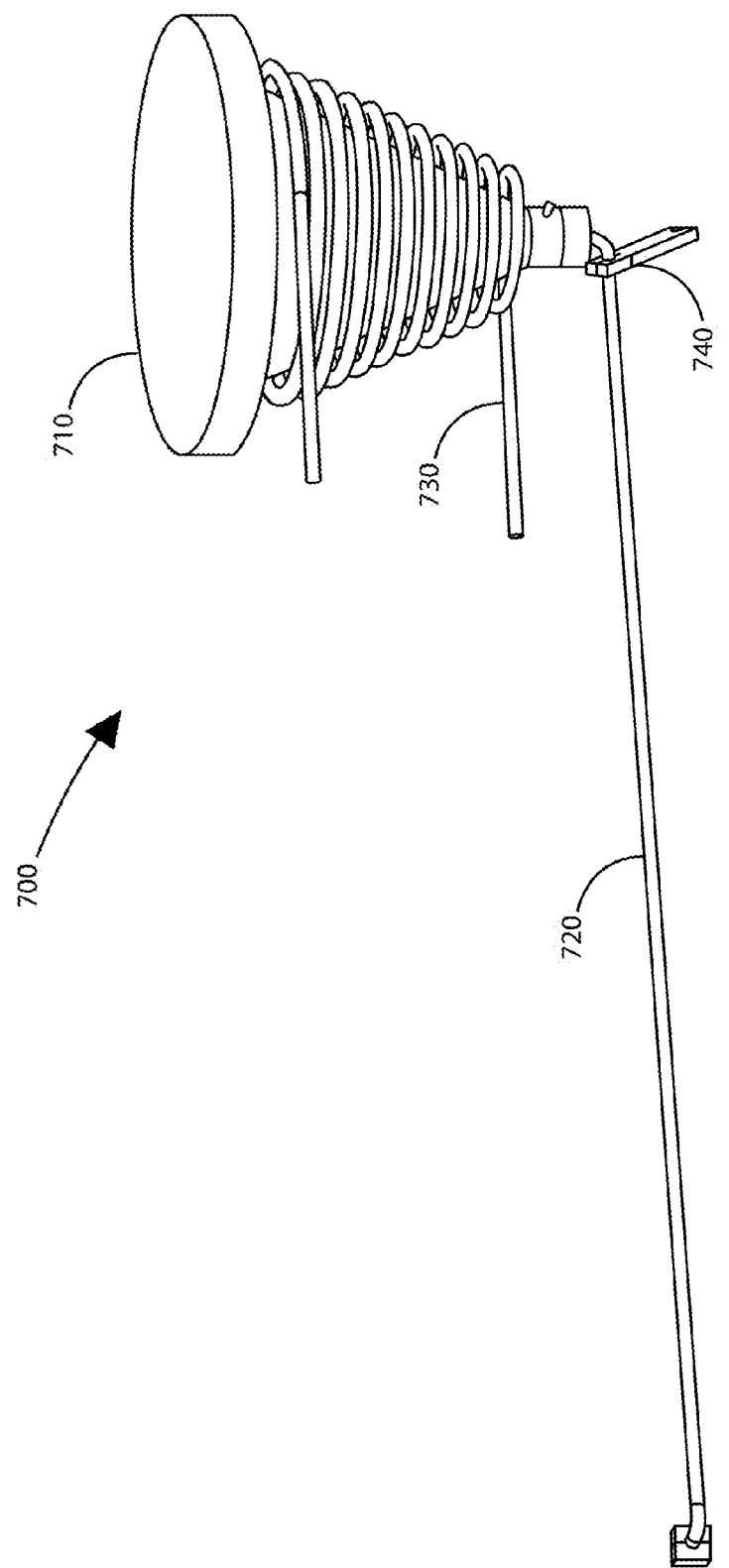
FIG. 7 is a simplified diagram of an apparatus for manufacturing according to an embodiment of the present invention.

FIG. 7 is a simplified diagram of an apparatus for manufacturing according to an embodiment of the present invention. This diagram is merely an illustration and should not unduly limit the scope of the claims herein. As shown, apparatus 700 includes deposition source material container 710 connected to a delivery tube 720. The container 710 can be coupled to a heating element 730. In specific embodiment, apparatus 700 can represent a liquid feeder for an anode deposition material. Similar to phase change delivery devices described previously, the container 710 can provide solid deposition material through the region heated by heating element 730. Heating the anode deposition material can cause a phase change to a liquid deposition material that is transported through delivery tube 720. The apparatus 700 can include a deposition feedback control 740. Those of ordinary skill in the art will recognize other variations, modifications, and alternatives.

Figure 8:
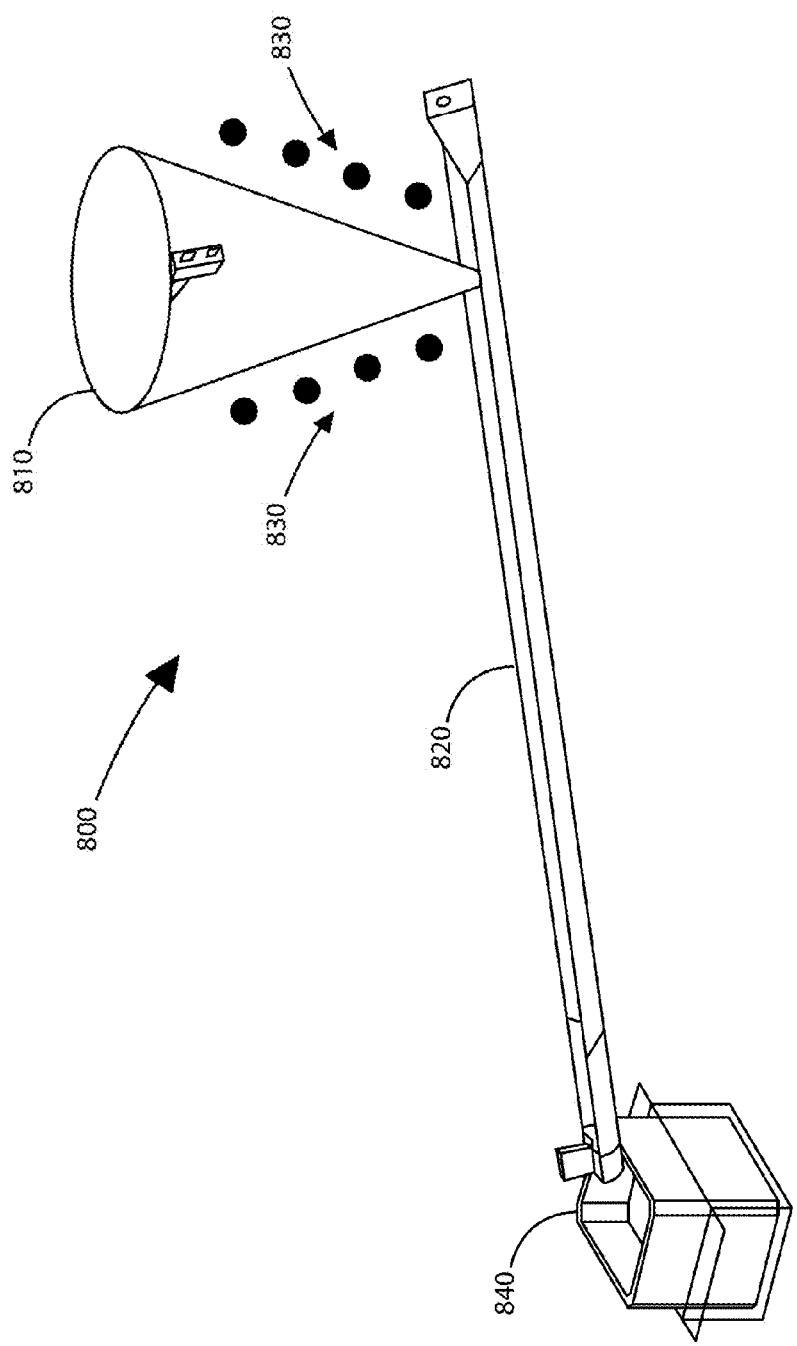
FIG. 8 is a simplified diagram of an apparatus for manufacturing according to an embodiment of the present invention.

FIG. 8 is a simplified diagram of an apparatus for manufacturing according to an embodiment of the present invention. This diagram is merely an illustration and should not unduly limit the scope of the claims herein. As shown, apparatus 800 includes deposition source material container 810 connected to a delivery tube 820. The container 810 can be coupled to a heating element 830. In specific embodiment, apparatus 800 can represent a liquid feeder for a cathode deposition material. Similar to phase change delivery devices described previously, the container 810 can provide solid deposition material through the region heated by heating element 830. Heating the cathode deposition material can cause a phase change to a liquid deposition material that is transported through delivery tube 820 to a hot wall reactor 840. Those of ordinary skill in the art will recognize other variations, modifications, and alternatives.

Figure 9:
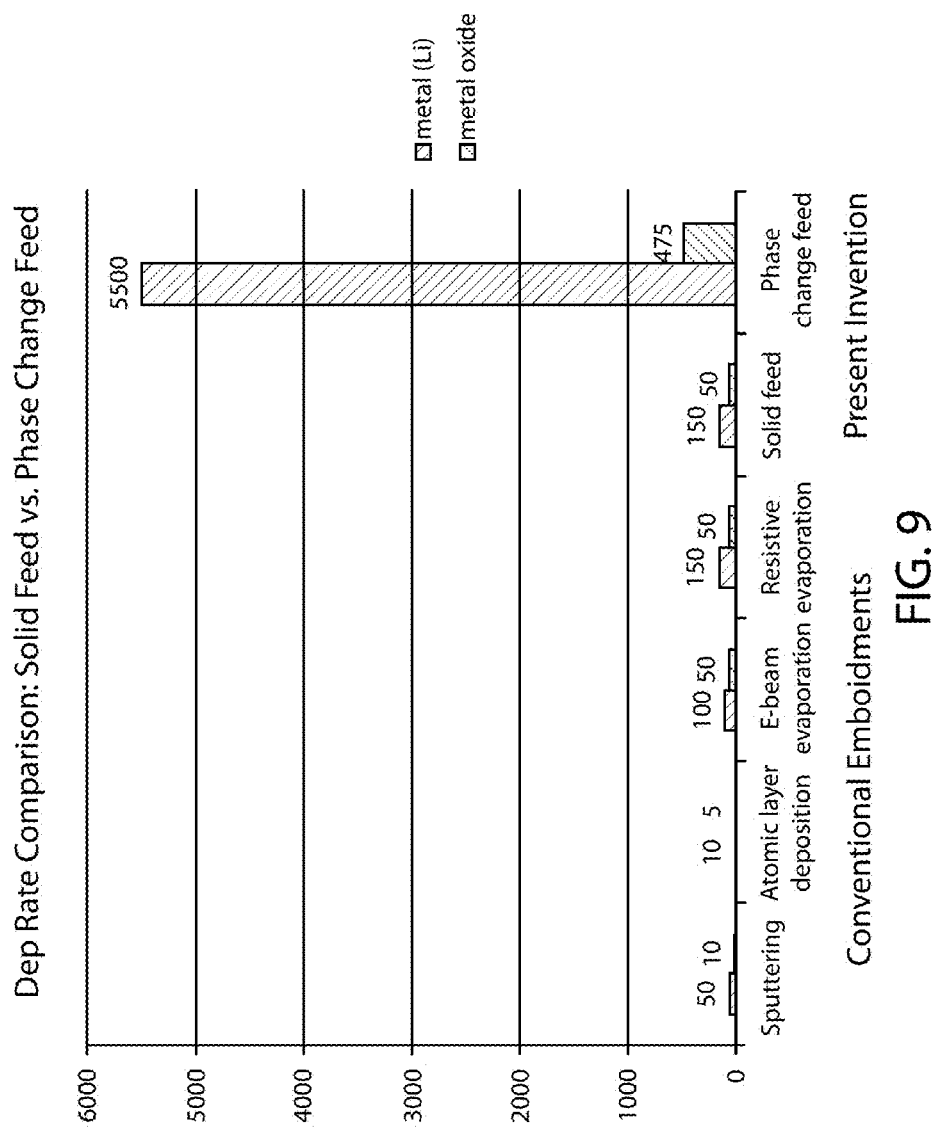
FIG. 9 is a graph showing the comparison of deposition rates from various film deposition technologies with embodiments of the present invention.

FIG. 9 is a graph showing the comparison of deposition rates from various film deposition technologies with embodiments of the present invention. Conventional methods, such as sputtering, atomic layer deposition, e-beam evaporation, and resistive evaporation have maximum deposition rates ranging from 5-50 Angstroms/sec for metal oxide and 10-150 Angstroms/sec for metal lithium. Depositions rates according to embodiments of the present invention achieve 50-150 Angstrom/sec deposition rates with the solid source process as described. The rate increases to 475 Angstroms/sec for metal oxide (850% increase) and to 5500 Angstroms/sec for metal lithium (3560% increase).

Figure 10:
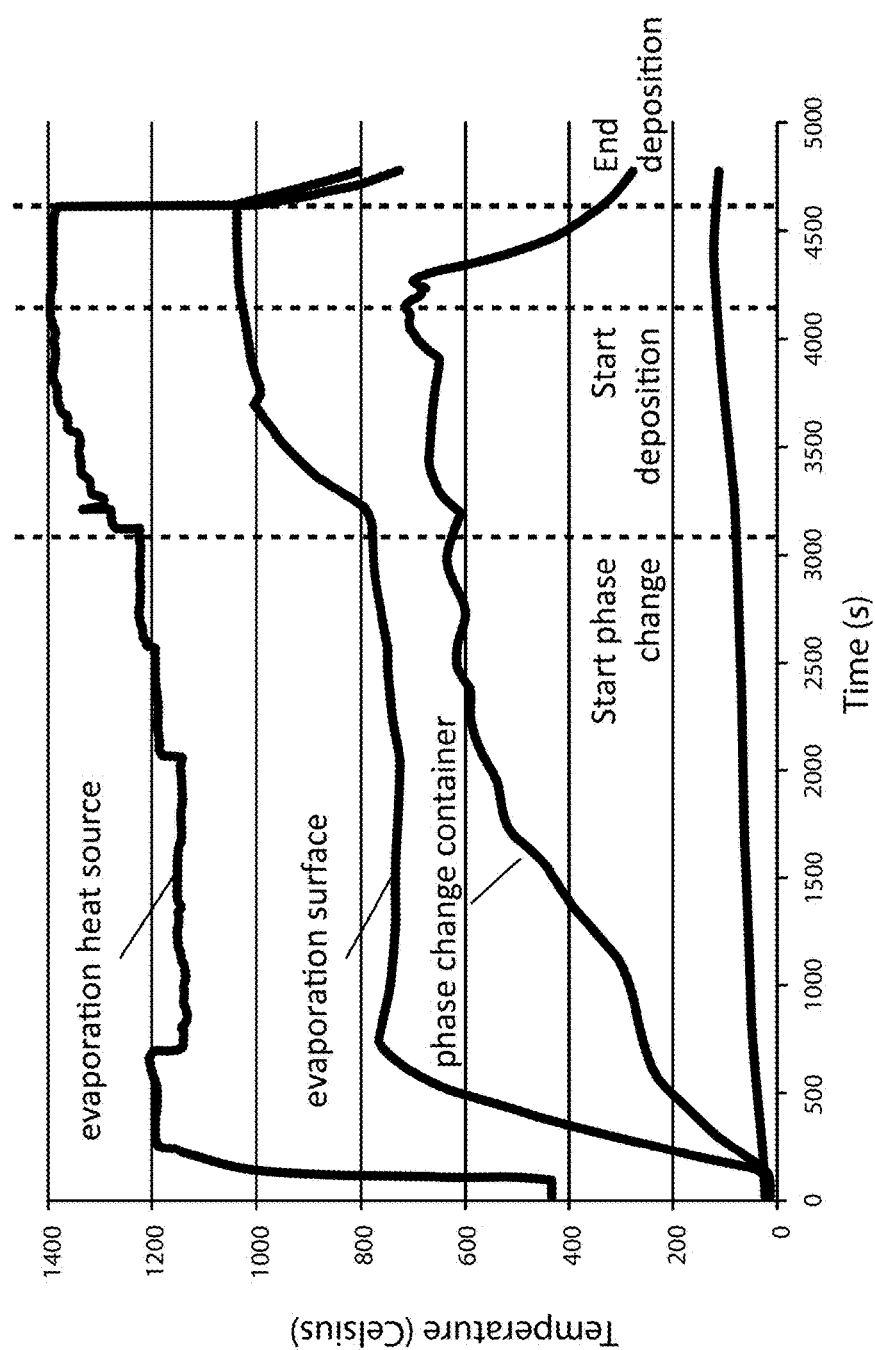
FIG. 10 is a graph showing the temperature profile measured from a phase change delivery apparatus according to embodiments of the present invention.

FIG. 10 is a graph showing the temperature profile measured from a phase change delivery apparatus according to embodiments of the present invention. These are empirical results from the embodiment described in FIG. 7. The temperature is monitored from various device locations, such as the phase change source container, delivery tube, evaporation heat source, evaporation surface, and others. These temperature data are monitored and recorded by a deposition controller for feedback control. For example, the temperature from the phase change container triggers the evaporation source heating of the evaporation surface for deposition, and the monitored deposition rate and thickness feed back to the temperature control. The labeled vertical lines in the plotted lines show some of these events, such as the start of phase change, start of deposition, and end of deposition.

Figure 11A:
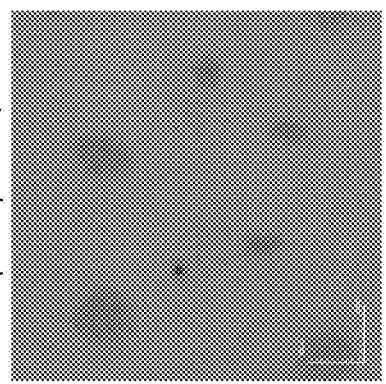
FIG. 11A is a confocal microscope image of a deposited metal oxide cathode sample with deposition rate of 12 Å/s.
Figure 11A:
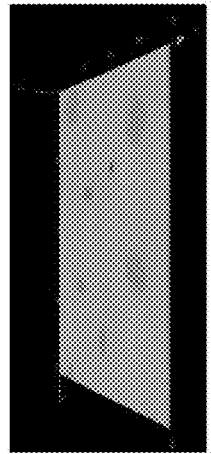
Figure 11B:
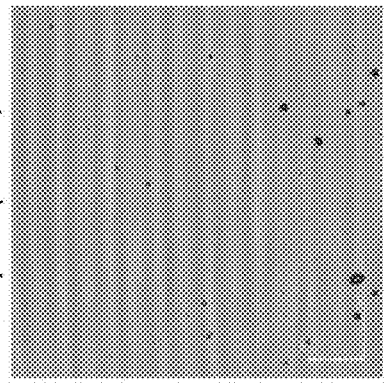
FIG. 11B is a confocal microscope image of a deposited metal oxide cathode sample with deposition rate of 40 Å/s.
Figure 11B:
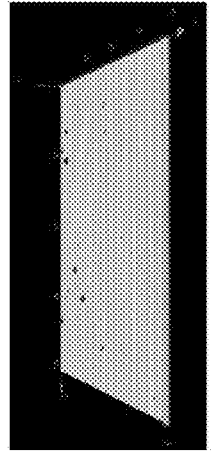
Figure 11C:
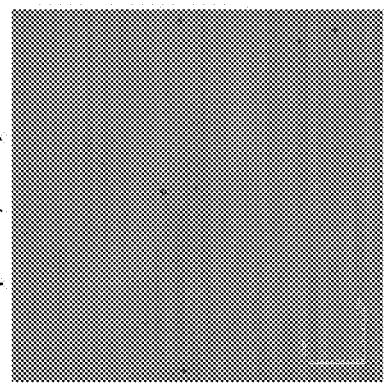
FIG. 11C is a confocal microscope image of a deposited metal oxide cathode sample with deposition rate of 475 Å/s.
Figure 11C:
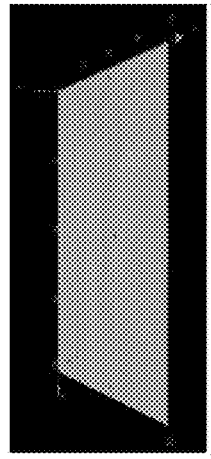

FIG. 11A is a confocal microscope image of a deposited metal oxide cathode sample with deposition rate of 12 Å/s. FIG. 11B is a confocal microscope image of a deposited metal oxide cathode sample with deposition rate of 40 Å/s. FIG. 11C is a confocal microscope image of a deposited metal oxide cathode sample with deposition rate of 475 Å/s. The 12 Å/s and 40 Å/s samples are from a solid source feed process, and the 475 Å/s rate from a phase change process. These data include the average flaw size and flaw density measured from the microscope. When the deposition rate was increased from 12 to 40 Å/s with the same solid feeding process, the resulting flaw size and density in the metal oxide cathode samples was found to increase by 60% and 80%. However, with a phase change process that increased the rate up to 475 Å/s or 40 times higher than the original rate of 12 Å/s, the average flaw size was actually 20% smaller than the solid feed process and the flaw density was around the same level as the 40 Å/s solid feed sample. The phase change process was the key enabler to achieve the high deposition rate with no significant penalty in the film quality.

While the above is a full description of the specific embodiments, various modifications, alternative constructions and equivalents may be used. Therefore, the above description and illustrations should not be taken as limiting the scope of the present invention which is defined by the appended claims.

The invention claimed is:

1. A vapor deposition apparatus for manufacturing electrochemical cells, the apparatus comprising:
   an evaporation region comprising a hot wall reactor comprising a spinning disc, the hot wall reactor configured to deliver vapor deposition material to an electrochemical cell substrate, wherein the hot wall reactor and the substrate are located within a same chamber; and
   a delivery device comprising a delivery tube, the delivery tube configured to deposit deposition material from a location above a surface of the spinning disc down onto the spinning disc of the hot wall reactor of the vapor deposition apparatus.

2. The apparatus of claim 1, wherein the delivery tube is heated.

3. The apparatus of claim 1, wherein the spinning disc is heated.

4. The apparatus of claim 1, wherein the spinning disc comprises one or more of carbon, titanium, stainless steel, Incoloy, Inconel, tantalum, tungsten, vanadium, and molybdenum.

5. The apparatus of claim 1, wherein the spinning disc comprises a scraping element configured to scrape a surface of the spinning disc.

6. The apparatus of claim 1, wherein the delivery tube comprises a spray nozzle or a solenoid for forming droplets or vaporized mist of deposition material on a surface of the spinning disc.

7. The apparatus of claim 1, wherein the delivery device is coupled to a mechanical linear drive.

8. The apparatus of claim 1, wherein the delivery device comprises a feedback loop to control one or more of a temperature, a mass flow, and a film thickness.

9. The apparatus of claim 1, wherein the delivery device comprises a deposition source material container configured to contain deposition source material.

10. The apparatus of claim 9, wherein the delivery device comprises a heating element configured to transfer heat to a lower portion of the deposition source material container.

11. The apparatus of claim 9, wherein the delivery device comprises a transferring element configured to apply a constant force to the deposition source material of an upper portion of the deposition source material container to transfer the deposition source material of the upper portion of the deposition source material container to a lower portion of the deposition source material container and to control a flow of the deposition source material.

12. The apparatus of claim 9, wherein the deposition source material container comprises an upper portion configured to comprise a solid material portion and a lower portion configured to comprise at least one of a liquid or gaseous material portion.

13. The apparatus of claim 12, wherein the solid material portion is in contact with the at least one of a liquid or gaseous material portion of the deposition source material container.

14. The apparatus of claim 12, wherein the solid material portion of the deposition source material container comprises a solid source material comprising lithium.

15. The apparatus of claim 12, wherein the solid material portion of the deposition source material container comprises a solid source material comprising metal.

16. A delivery device for a vapor deposition apparatus comprising:
    a deposition source material container comprising an upper portion configured to comprise a solid deposition source material and a lower portion configured to comprise at least one of a liquid or gaseous deposition source material;
    a transferring element configured to apply a constant force to the solid deposition source material of the upper portion to transfer the solid deposition material of the upper portion to the lower portion of the deposition source material container and to control a flow of the deposition source material, wherein the transferring element is one or more of an auger, a piston, or a moveable plate;
    a heating element configured to transfer heat to the lower portion of the deposition source material container to cause a phase change in the deposition material from a solid to one or more of a liquid or a gas; and
    a delivery tube configured to deliver the liquid or gaseous deposition source material to an evaporation region of the vapor deposition apparatus.

17. The device of claim 16, wherein the delivery tube is heated.

18. The device of claim 16, comprising a feedback loop to control one or more of a temperature, a mass flow, and a film thickness.

19. The device of claim 16, comprising a weight for providing a constant force to the deposition source material in the deposition source material container.

20. The device of claim 16, wherein the device is coupled to a mechanical linear drive.

21. The device of claim 16, wherein the solid material of the upper portion of the deposition source material container is in contact with the at least one of a liquid or gaseous material of the lower portion of the deposition source material container.

22. The device of claim 16, wherein the upper portion of the deposition source material container comprises a solid source material comprising lithium.

23. The device of claim 16, wherein the upper portion of the deposition source material container comprises a solid source material comprising metal.

* * * * *